(12) United States Patent
Nagaoki et al.

(10) Patent No.: US 10,083,814 B2
(45) Date of Patent: Sep. 25, 2018

(54) ELECTRON MICROSCOPE AND SAMPLE OBSERVATION METHOD

(71) Applicant: Hitachi High-Technologies Corporation, Minato-ku, Tokyo (JP)

(72) Inventors: Isao Nagaoki, Tokyo (JP); Toshiyuki Oyagi, Tokyo (JP); Hiroaki Matsumoto, Tokyo (JP); Kiyotaka Nakano, Tokyo (JP); Takeshi Sato, Tokyo (JP); Yasuhira Nagakubo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/781,634

(22) PCT Filed: Mar. 20, 2014

(86) PCT No.: PCT/JP2014/057874
§ 371 (c)(1),
(2) Date: Oct. 1, 2015

(87) PCT Pub. No.: WO2014/162901
PCT Pub. Date: Oct. 9, 2014

(65) Prior Publication Data
US 2016/0064183 A1   Mar. 3, 2016

(30) Foreign Application Priority Data

Apr. 2, 2013   (JP) .................................. 2013-077175

(51) Int. Cl.
*H01J 37/00*   (2006.01)
*H01J 37/244*   (2006.01)
(Continued)

(52) U.S. Cl.
CPC ............ *H01J 37/244* (2013.01); *H01J 37/06* (2013.01); *H01J 37/16* (2013.01); *H01J 37/18* (2013.01);
(Continued)

(58) Field of Classification Search
CPC ........ H01J 37/244; H01J 37/18; H01J 37/285; H01J 37/06; H01J 37/16; H01J 37/28;
(Continued)

(56) References Cited

U.S. PATENT DOCUMENTS 5,578,823 A * 11/1996 Taniguchi ............... H01J 37/28
                                                         250/305
6,768,114 B2 * 7/2004 Takagi .................. H01J 37/222
                                                         250/306
(Continued)

FOREIGN PATENT DOCUMENTS

JP   9-196831 A    7/1997
JP   10-134751 A   5/1998
(Continued)

OTHER PUBLICATIONS

International Preliminary Report on Patentability (PCT/IB/338) issued in PCT Application No. PCT/JP2014/057874 dated Oct. 8, 2015, including English translation of document C2 (Japanese language Written Opinion (PCT/ISA/237)) previously filed Oct. 8, 2015 (nine (9) pages).
(Continued)

*Primary Examiner* — Michael Maskell
(74) *Attorney, Agent, or Firm* — Crowell & Moring LLP

(57) ABSTRACT

An electron microscope includes a secondary electron detector (51) which detects an electron generated when a sample (70) is illuminated with an electron beam from an electron gun (1), a monitor (39) which displays a secondary electron image of the sample based on an output of the detector, a gas
(Continued)

inlet device (60) which emits gas to the sample, and a gas control device (81) which controls a gas emitting amount of the gas inlet device so that a degree of vacuum in an intermediate chamber (74) in which the secondary electron detector is installed may be kept at less than a set value P1 during gas emission performed by the gas inlet device. Accordingly, a microscopic image of the sample in a gas atmosphere with use of the detector requiring application of voltage is obtained.

13 Claims, 12 Drawing Sheets

(51) Int. Cl.
    *H01J 37/16* (2006.01)
    *H01J 37/20* (2006.01)
    *H01J 37/28* (2006.01)
    *H01J 37/06* (2006.01)
    *H01J 37/18* (2006.01)
    *H01J 37/285* (2006.01)

(52) U.S. Cl.
    CPC .............. *H01J 37/20* (2013.01); *H01J 37/28* (2013.01); *H01J 37/285* (2013.01); *H01J 2237/006* (2013.01); *H01J 2237/182* (2013.01); *H01J 2237/2448* (2013.01); *H01J 2237/24475* (2013.01); *H01J 2237/2802* (2013.01)

(58) Field of Classification Search
    CPC ............. H01J 37/20; H01J 2237/24475; H01J 2237/2448; H01J 2237/006; H01J 2237/182; H01J 2237/2802
    USPC ................................. 250/306, 307, 310, 311
    See application file for complete search history.

(56) References Cited

U.S. PATENT DOCUMENTS

| | | | | |
|---|---|---|---|---|
| 2004/0262516 | A1* | 12/2004 | Motoi | G01N 23/04 250/306 |
| 2007/0187597 | A1* | 8/2007 | Suzuki | H01J 37/3005 250/310 |
| 2008/0093565 | A1* | 4/2008 | Yaguchi | H01J 37/16 250/440.11 |
| 2009/0101817 | A1* | 4/2009 | Ohshima | H01J 37/244 250/310 |

FOREIGN PATENT DOCUMENTS

| | | | | |
|---|---|---|---|---|
| JP | 10134751 | A | * 5/1998 | ............. H01J 37/28 |
| JP | 2000-241372 | A | 9/2000 | |
| JP | 2002-83564 | A | 3/2002 | |
| JP | 2003-187735 | A | 7/2003 | |
| JP | 2004-335242 | A | 11/2004 | |
| JP | 2007-214088 | A | 8/2007 | |
| JP | 2008-108429 | A | 5/2008 | |
| JP | 2009-99468 | A | 5/2009 | |

OTHER PUBLICATIONS

International Search Report (PCT/ISA/210) issued in PCT Application No. PCT/JP2014/057874 dated May 13, 2014, with English translation (four (4) pages).

Written Opinion (PCT/ISA/237) issued in PCT Application No. PCT/JP2014/057874 dated May 13, 2014 (four (4) pages).

International Preliminary Examination Report (PCT/IPEA/409) issued in PCT Application No. PCT/JP2014/057874 dated Nov. 5, 2014 (five (5) pages).

* cited by examiner

EXAMPLE OF DISPLAYING SECONDARY ELECTRON IMAGE, DEGREE OF VACUUM, AND TEMPERATURE

EXAMPLE OF DISPLAYING TRANSMISSION IMAGE, DEGREE OF VACUUM, AND TEMPERATURE

SECONDARY ELECTRON IMAGE (BEFORE GAS INLET) → DARK FIELD IMAGE (BEFORE GAS INLET) → SECONDARY ELECTRON IMAGE (AFTER GAS INLET) → DARK FIELD IMAGE (AFTER GAS INLET)

BEFORE GAS INLET

AFTER GAS INLET

AFTER GAS INLET

ELECTRON MICROSCOPE AND SAMPLE OBSERVATION METHOD

TECHNICAL FIELD

The present invention relates to an electron microscope.

BACKGROUND ART

In a sample observation using an electron microscope, a so-called "in-situ observation," in which a sample in a gas atmosphere and a reaction process of the gas are dynamically observed in situ, is performed in some cases. For example, as for a fuel cell catalyst, when the catalyst is exposed to gas, precious metal particles move on a support, and particle growth occurs. The particle growth is observed in situ to perform a catalyst deterioration analysis.

To perform the observation of this kind, it is necessary to divide a main space in a column held in a high vacuum state from a space around the sample held in a low vacuum state by gas. A method therefor is roughly classified into a diaphragm type and a differential pumping type. As one of techniques relating to the former type, JP 2003-187735 A describes a sample holder sealing a sample in a gas atmosphere, for example. This sample holder includes a sample mounting portion provided with an opening adapted to let an electron beam pass therethrough, a heater wire (a sample heating device) stretched to cross the opening, a diaphragm adapted to isolate the sample mounting portion from a sample chamber (vacuum), and a gas inlet tube (a gas inlet device) adapted to introduce gas into a sample mounting space formed by the diaphragm.

CITATION LIST

Patent Literature

PTL 1: Publication of JP 2003-187735 A

SUMMARY OF INVENTION

Technical Problem

In the above in-situ observation of the sample in the gas atmosphere and in the low vacuum state, when a detector requiring application of voltage such as a secondary electron detector is to be used, the applied voltage may cause electric discharge. For this reason, in the in-situ observation, a transmission electron microscopic image (a TEM image or an STEM image) obtained by letting electrons transmitted in the sample in a transmission electron microscope (TEM) or a scanning transmission electron microscope (STEM) has been used. Accordingly, although a two-dimensional change of the sample based on the transmission electron microscopic image (e.g., a moving state of particles of a catalyst in a horizontal direction) can be observed in situ, a three-dimensional change of the sample (e.g., a moving state of the particles of the catalyst in a height direction), which can be viewed well on a secondary electron image, cannot be observed in situ. Also, since the transmission electron microscopic image and the secondary electron image of the sample cannot be obtained at the same time, they cannot be observed in comparison.

Meanwhile, as special detectors for obtaining a secondary electron image in a low vacuum state, there exist a low vacuum secondary electron detector (an ESED detector) detecting an electron beam secondarily generated from an electron beam contacting vapor in a low vacuum of 50 Pa or more and a UV detector detecting light secondarily generated in a similar manner. However, these detectors cannot be used in a vacuum state of less than 50 Pa (e.g., $10^{-6}$ Pa to 10 Pa). Accordingly, the in-situ observation in which the three-dimensional change of the sample is observed while gas is introduced cannot still be performed.

An object of the present invention is to provide an electron microscope which can provide a microscopic image of a sample in a gas atmosphere with use of a detector requiring application of voltage.

Solution to Problem

In order to achieve the above-described object, the present invention includes a detector which detects an electron generated when a sample is illuminated with an electron beam from an electron gun, a display device which displays a microscopic image of the sample based on an output of the detector, a gas inlet device which emits gas to the sample, and a gas control device which controls a gas emitting amount of the gas inlet device so that a degree of vacuum in a space in which the detector is installed may continuously be kept at less than a set value during gas emission performed by the gas inlet device.

Advantageous Effects of Invention

According to the invention, a detector requiring application of voltage can be used in an in-situ observation of a sample in a gas atmosphere.

DESCRIPTION OF EMBODIMENTS

Hereinbelow, embodiments of the present invention will be described with reference to the drawings. It is to be noted that, although a scanning transmission electron microscope (STEM) is taken as an example in the following description, the present invention can be applied not only to a scanning electron microscope (SEM), a transmission electron microscope (TEM), and an electron microscope including the scanning transmission electron microscope but also to a charged particle beam apparatus.

Figure 1:
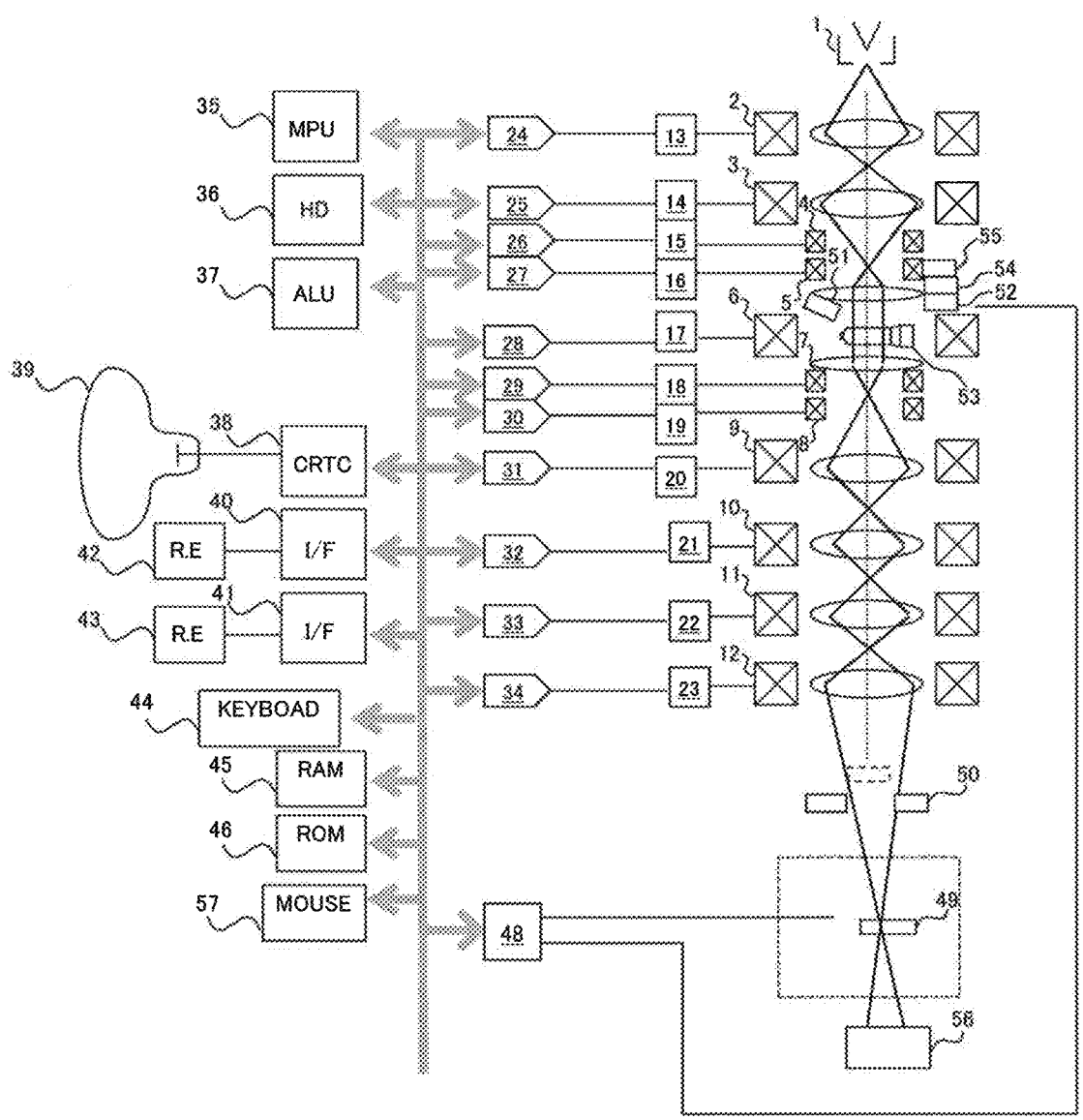
FIG. 1 is a schematic configuration diagram of a scanning transmission electron microscope according to an embodiment of the present invention.

FIG. 1 is a schematic configuration diagram of a scanning transmission electron microscope according to an embodiment of the present invention. An electron microscope apparatus illustrated in the figure includes an electron gun 1, first and second illumination lens coils 2 and 3, first and second deflection coils (scanning coils) 4 and 5, an objective lens coil 6, first and second electromagnetic sample image moving coils 7 and 8, first and second intermediate lens coils 9 and 10, first and second projection lens coils 11 and 12, excitation power supplies 13 to 23, digital-analog converters (DACs) 24 to 34, a microprocessor (MPU) 35, a hard disk drive (HDD) 36, an arithmetic logical unit (ALU) 37, a monitor controller (CRT controller) 38, a monitor (CRT) 39, interfaces (I/Fs) 40 and 41, a magnification changing rotary encoder (RE) 42, an input rotary encoder (RE) 43, a keyboard 44, a mouse 57, a RAM 45, a ROM 46, and an image capturing interface 48. A sample holder 53 holding a sample 70 (refer to FIG. 3) is arranged on an optical axis. The objective lens coil 6 illustrated in the figure is a strongly excited lens (refer to FIG. 4), and lenses are formed on upper and lower sides of the sample.

Figure 2:
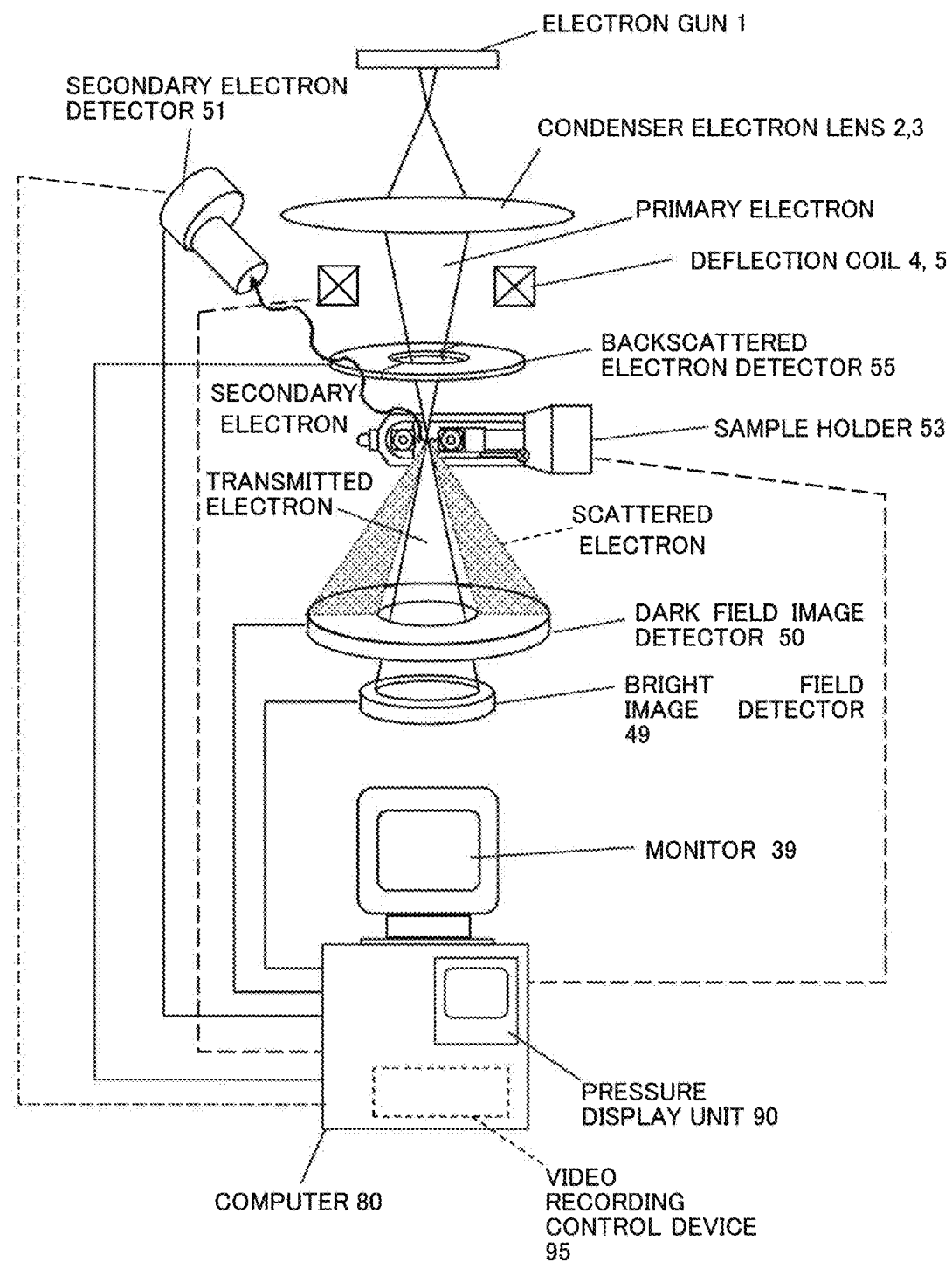
FIG. 2 illustrates a scanning transmission electron microscope part used to obtain a scanning transmission image in an electron microscope apparatus according to the embodiment of the present invention.

FIG. 2 illustrates a main part relating to the present invention extracted from the electron microscope apparatus according to the embodiment of the present invention. In this figure, an electron microscope part according to the present embodiment includes the electron gun 1, a condenser electron lens consisting of the illumination lens coils 2 and 3, the deflection coils (scanning coils) 4 and 5 serving as scanning devices scanning the sample 70 (refer to FIG. 3) with an electron beam generated from the electron gun 1, the sample holder 53 holding the sample 70, detectors detecting electrons generated when the sample 70 is illuminated with the electron beam from the electron gun 1 (a secondary electron detector 51, a backscattered electron detector 55, a dark field image detector 50, and a bright field image detector 49), a computer 80, the monitor 39 displaying microscopic images of the sample 70 based on outputs of the detectors 51, 55, 50, and 49, and a pressure display unit 90 displaying the degree of vacuum at each part in the microscope body. The computer 80 has built therein the parts of the hardware illustrated in FIG. 1 such as the microprocessor 35, the HDD 36, the monitor controller 38, the RAM 45, the ROM 46, and the image capturing interface 48 and a video recording control device 95 recording the microscopic images displayed on the monitor 39.

Figure 3:
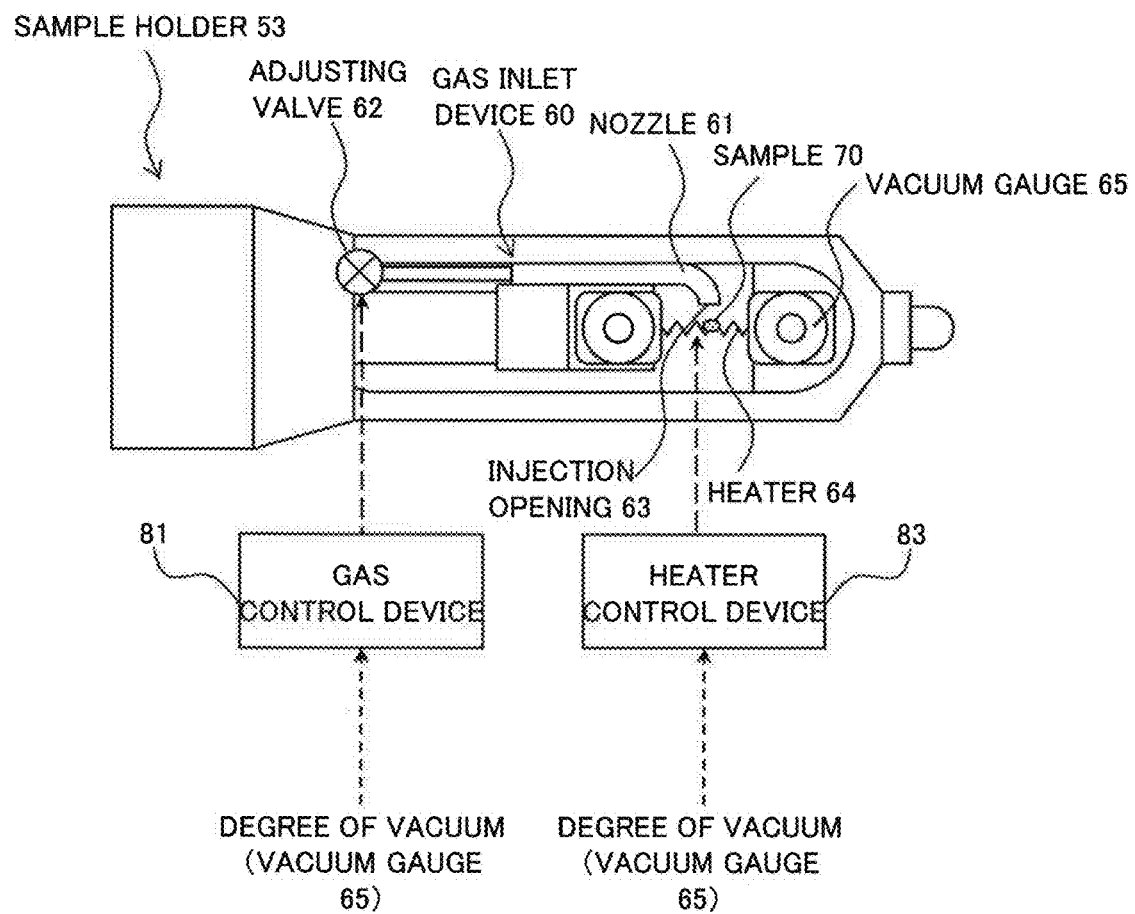
FIG. 3 is a schematic configuration diagram of a sample holder 53 according to the embodiment of the present invention.

FIG. 3 is a schematic configuration diagram of the sample holder 53 according to the embodiment of the present invention. As illustrated in this figure, the sample holder 53 includes a heater (a heating device) 64, a vacuum gauge 65, and a gas inlet device 60.

The heater 64 is constituted by a wire built between leads as a pair connected to a power supply (not illustrated), and the sample 70 is attached and held to the wire. That is, the heater 64 also functions as a sample holding portion. The heater 64 is provided with a temperature sensor, which can detect a temperature of the sample 70. An output of the temperature sensor (or a sample temperature) is output to the computer 80 and is displayed on the monitor 39 as needed. The output of the heater 64 is controlled based on a control signal output to the heater 64 from a heater control device 83 built in the computer 80.

The vacuum gauge 65 is adapted to detect the degree of vacuum (pressure) around the sample 70 and is installed in the sample holder 53. Although the vacuum gauge 65 is attached to the sample holder 53 so as to be located within 1 mm from the sample 70 in the example illustrated in the figure, the vacuum gauge 65 may be installed independently from the sample holder 53. An output of the vacuum gauge 65 (pressure around the sample 70) is output to the computer 80, is displayed on the pressure display unit 90 (refer to FIG. 2), and is used for control of the gas emitting amount by the gas inlet device 60 (described below).

Figure 4:
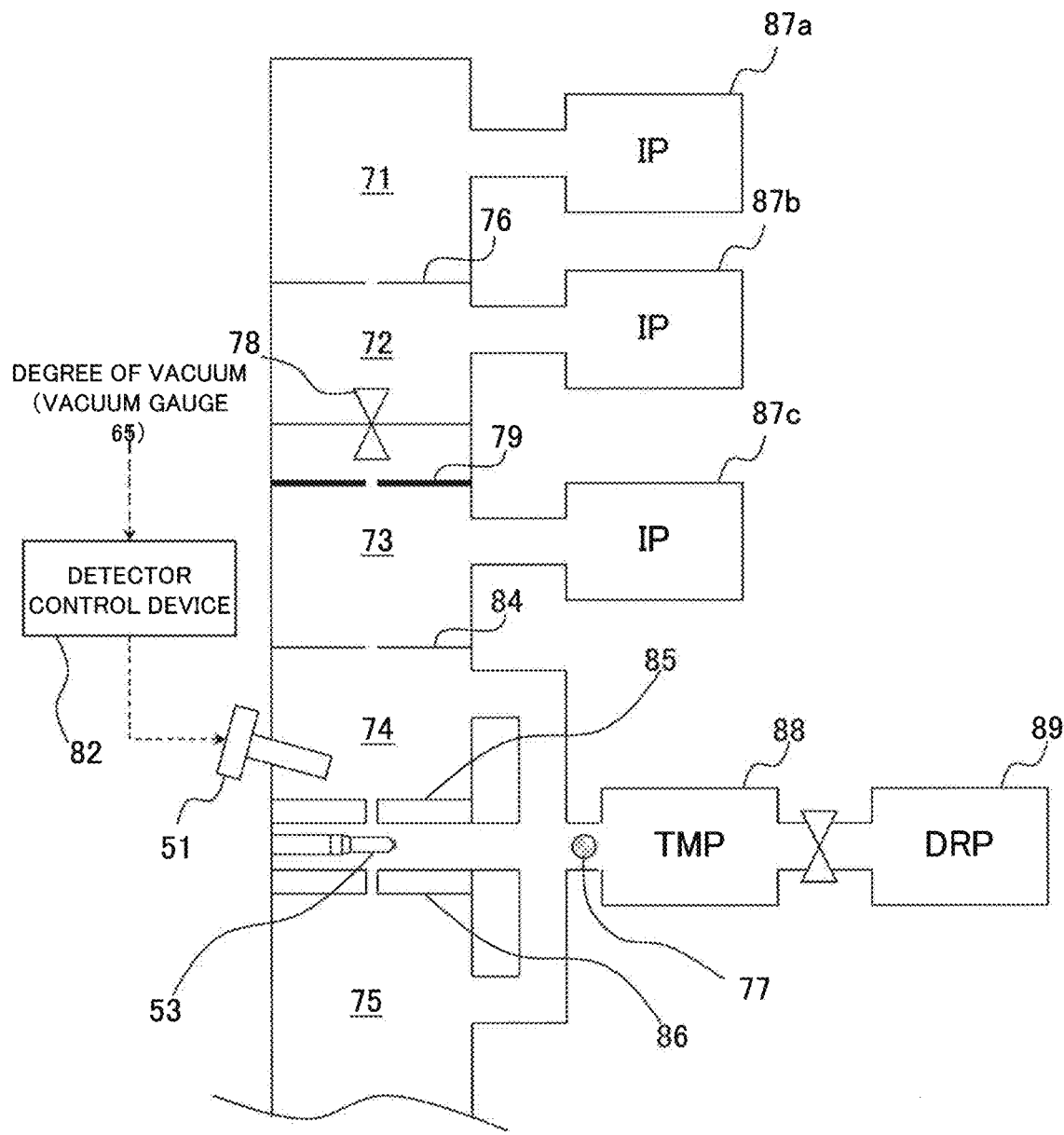
FIG. 4 is a schematic view of partitioning into respective chambers provided in a microscope body of the electron microscope according to the embodiment of the present invention.

FIG. 4 is a schematic view of partitioning into respective chambers provided in the microscope body of the electron microscope according to the embodiment of the present invention. The microscope body of the electron microscope according to the present embodiment can be partitioned into an electron gun chamber 71, a first intermediate chamber 72, a second intermediate chamber 73, a third intermediate chamber 74, and a sample chamber 75. As a partition wall dividing the electron gun chamber 71 from the first intermediate chamber 72, a first orifice 76 is installed. As a partition wall dividing the first intermediate chamber 72 from the second intermediate chamber 73, a gun valve 78 is installed. As a partition wall provided in the second intermediate chamber, a second orifice 79 is installed, and as a partition wall dividing the second intermediate chamber 73 from the third intermediate chamber 74, a third orifice 84 is installed. The third intermediate chamber 74 and the sample chamber 75 are divided from each other by an upper magnetic pole 85 of the objective lens, and the sample holder 53 is arranged between the upper magnetic pole 85 and a lower magnetic pole 86 of the objective lens in the sample chamber 75.

A vacuum pump (ion pump) 87*a* is connected to the electron gun chamber 71, a vacuum pump (ion pump) 87*b* is connected to the first intermediate chamber 72, and a vacuum pump (ion pump) 87c is connected to the second intermediate chamber 73. Same vacuum pumps (a turbo-molecular pump 88 and a dry pump 89) are connected to the third intermediate chamber 74, a space formed between the upper magnetic pole 85 and the lower magnetic pole 86, and a space located further on a lower side than the lower magnetic pole 86 via independent paths.

In the third intermediate chamber 74 is installed the secondary electron detector 51 to which predetermined voltage (extraction voltage) is applied at the time of detecting secondary electrons generated by the electron beam from the electron gun 1. Application of voltage to the secondary electron detector 51 is controlled based on a control signal output to the secondary electron detector 51 from a detector control device 82 built in the computer 80. A vacuum gauge 77 is installed at a suction opening of the turbo-molecular pump 88, and a detection value of the vacuum gauge 77 is output to the computer 80.

Figure 5:
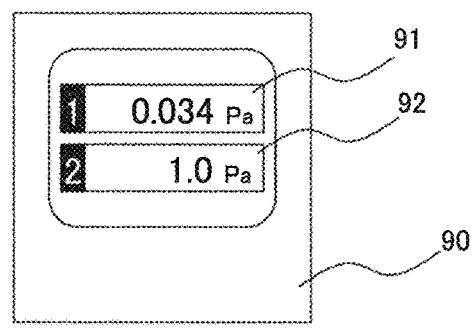
FIG. 5 is a schematic configuration diagram of a pressure display unit 90 according to the embodiment of the present invention.

FIG. 5 is a schematic configuration diagram of the pressure display unit 90 according to the embodiment of the present invention. The pressure display unit 90 illustrated in this figure includes a first display part 91 displaying a detection value of the vacuum gauge 77 installed close to the suction opening of the turbo-molecular pump 88 and a second display part 92 displaying a detection value of the vacuum gauge 65 installed in the sample holder 53. In the example in this figure, pressure at the suction opening of the turbo-molecular pump 88 is 0.034 [Pa] while pressure around the sample 70 is kept at 1.0 [Pa].

Returning to FIG. 3, the gas inlet device 60 is adapted to emit gas to the sample 70 illuminated with the electron beam generated by the electron gun 1. The gas inlet device 60 is connected to a gas cylinder (not illustrated) and includes a gas nozzle 61 having at a tip end thereof an injection opening 63 opened in the sample holder 53 and an adjusting valve 62 adapted to adjust the gas emitting amount to be emitted from the injection opening 63. The injection opening 63 is opposed to the heater 64, and gas from the injection opening 63 is emitted to the sample 70 on the wire of the heater 64. The adjusting valve 62 is an electromagnetic valve, and opening of the adjusting valve 62 is controlled based on a control signal output from a gas control device 81.

The gas control device 81 is adapted to control the gas inlet amount (emitting amount) of the gas inlet device 60 so that the degree of vacuum in the third intermediate chamber 74, in which the secondary electron detector 51 is installed, may continuously be kept at less than a set value P1 during gas inlet performed by the gas inlet device 60. The gas control device 81 is built in the computer 80. The gas control device 81 receives an output of the vacuum gauge 65 and adjusts the gas inlet amount (emitting amount) to the sample holder 53 based on the degree of vacuum received from the vacuum gauge 65. Specifically, in a case in which a pressure value input from the vacuum gauge 65 is less than the set value P1, the gas control device 81 keeps the adjusting valve 62 to have predetermined opening. In a case in which a pressure value input from the vacuum gauge 65 is the set value P1 or more, the gas control device 81 closes the adjusting valve 62 to execute processing of stopping emission of gas from the gas inlet device 60 to the sample 70.

Figure 6:
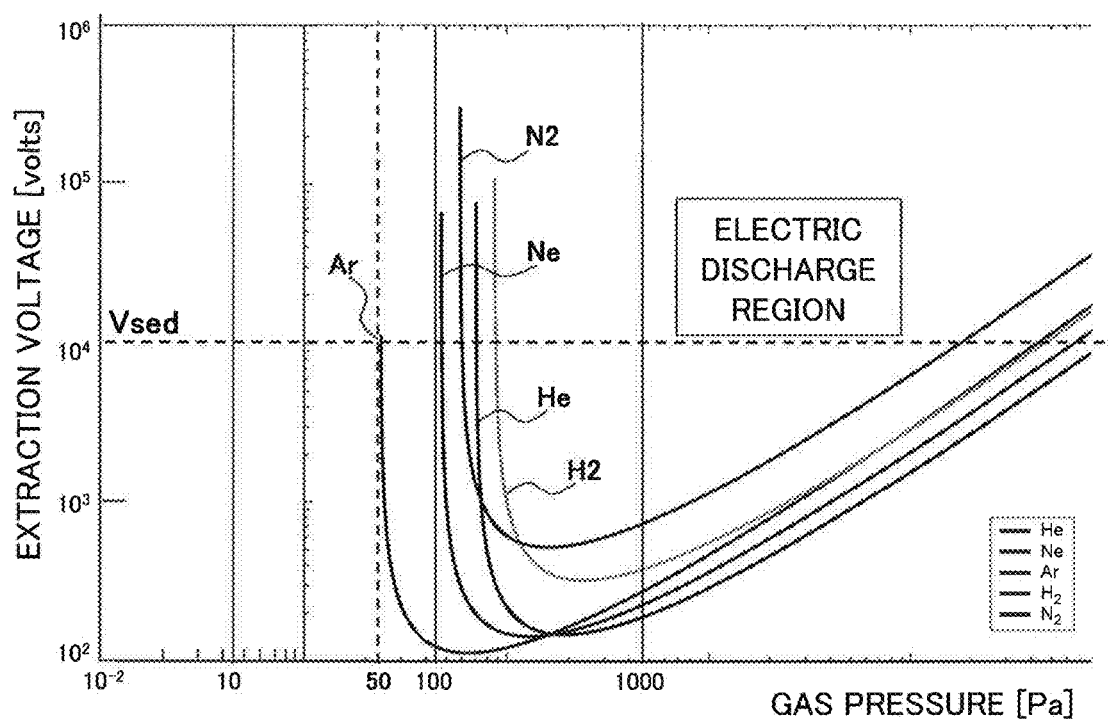
FIG. 6 illustrates a region of pressure values that do not cause electric discharge for helium, neon, argon, hydrogen, and nitrogen.

The set value P1 relating to control of the gas inlet amount is determined based on a value of voltage (extraction voltage) to be applied to the secondary electron detector 51 and a kind of gas to be introduced from the gas inlet device 60 and is set to prevent electric discharge from being generated when the extraction voltage is applied to the secondary electron detector 51. FIG. 6 illustrates a region of pressure values that do not cause electric discharge for helium (He), neon (Ne), argon (Ar), hydrogen ($H_2$), and nitrogen ($N_2$). In this figure, Vsed is an extraction voltage value of the secondary electron detector 51 used in the present embodiment, and a region in the graph located on upper sides of respective curves represents a region in which electric discharge is generated (electric discharge region). In the present embodiment, it is assumed that gas containing argon, in which the pressure causing electric discharge is the lowest, is introduced, and 50 [Pa], which is an asymptotic value of the argon curve, is set as the set value P1. Accordingly, keeping the pressure value around the sample less than 50 [Pa] can bring about a state in which no electric discharge is generated even when the voltage is applied to the secondary electron detector 51.

Figure 7:
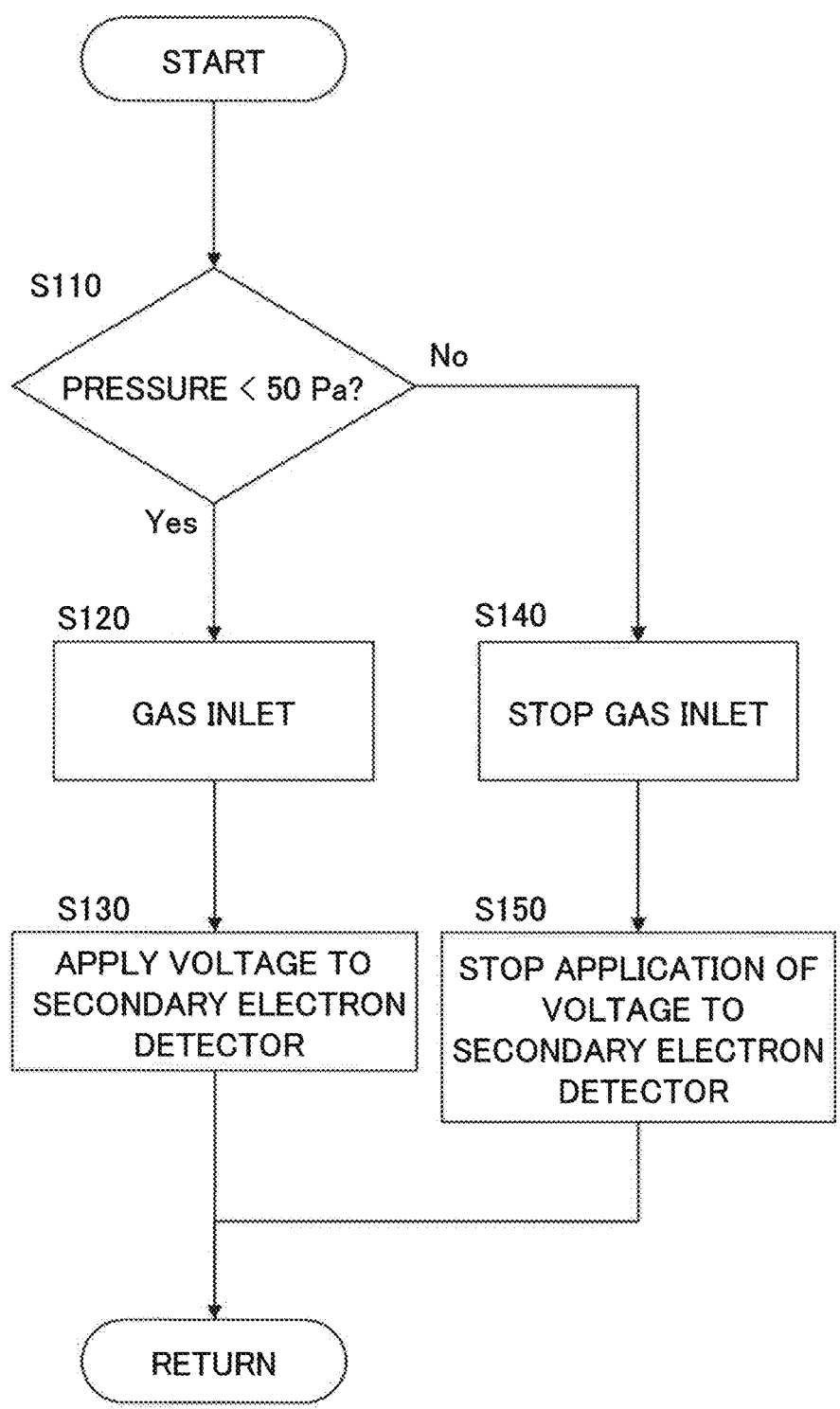
FIG. 7 is a flowchart of control processing of a gas inlet device 60 and a secondary electron detector 51 according to the embodiment of the present invention.

FIG. 7 is a flowchart of control processing of the gas inlet device 60 and the secondary electron detector 51 according to the embodiment of the present invention. When the processing illustrated in this figure is started, the gas control device 81 and the detector control device 82 determine whether or not the pressure value indicated by the vacuum gauge 65 is less than P1 (50 [Pa]) (S110).

When the pressure value of the vacuum gauge 65 is less than P1 in S110, the gas control device 81 controls the adjusting valve 62 so that the opening of the adjusting valve 62 may be a predetermined value, and gas inlet to the sample from the gas inlet device 60 is started (S120). Subsequently, the detector control device 82 applies extraction voltage to the secondary electron detector 51 (S130), and the processing returns to S110. Accordingly, since the pressure around the secondary electron detector 51 is kept at less than 50 [Pa] even in a gas atmosphere to prevent electric discharge from being generated, a secondary electron image of the sample 70 in the gas atmosphere can be obtained continuously. Thus, a moving image of the secondary electron image of the sample 70 in the gas atmosphere can be obtained. Meanwhile, an image obtained based on a detection value of a detector without fear of electric discharge since no voltage is applied at the time of detection of electrons is naturally obtained as a moving image.

Conversely, when the pressure value of the vacuum gauge 65 is P1 or more in S110, the gas control device 81 closes the adjusting valve 62, and gas inlet to the sample from the gas inlet device 60 is stopped (S140). Subsequently, the detector control device 82 stops application of extraction voltage to the secondary electron detector 51 (S150), and the processing returns to S110. Since the sample chamber 75 housing the sample holder 53 is evacuated by the vacuum pumps (the turbo-molecular pump 88 and the dry pump 89) at a fixed evacuation volume, the pressure around the sample 70 decreases toward a value less than the set value P1 when gas inlet by the gas control device 81 is stopped as described above.

Figure 8:
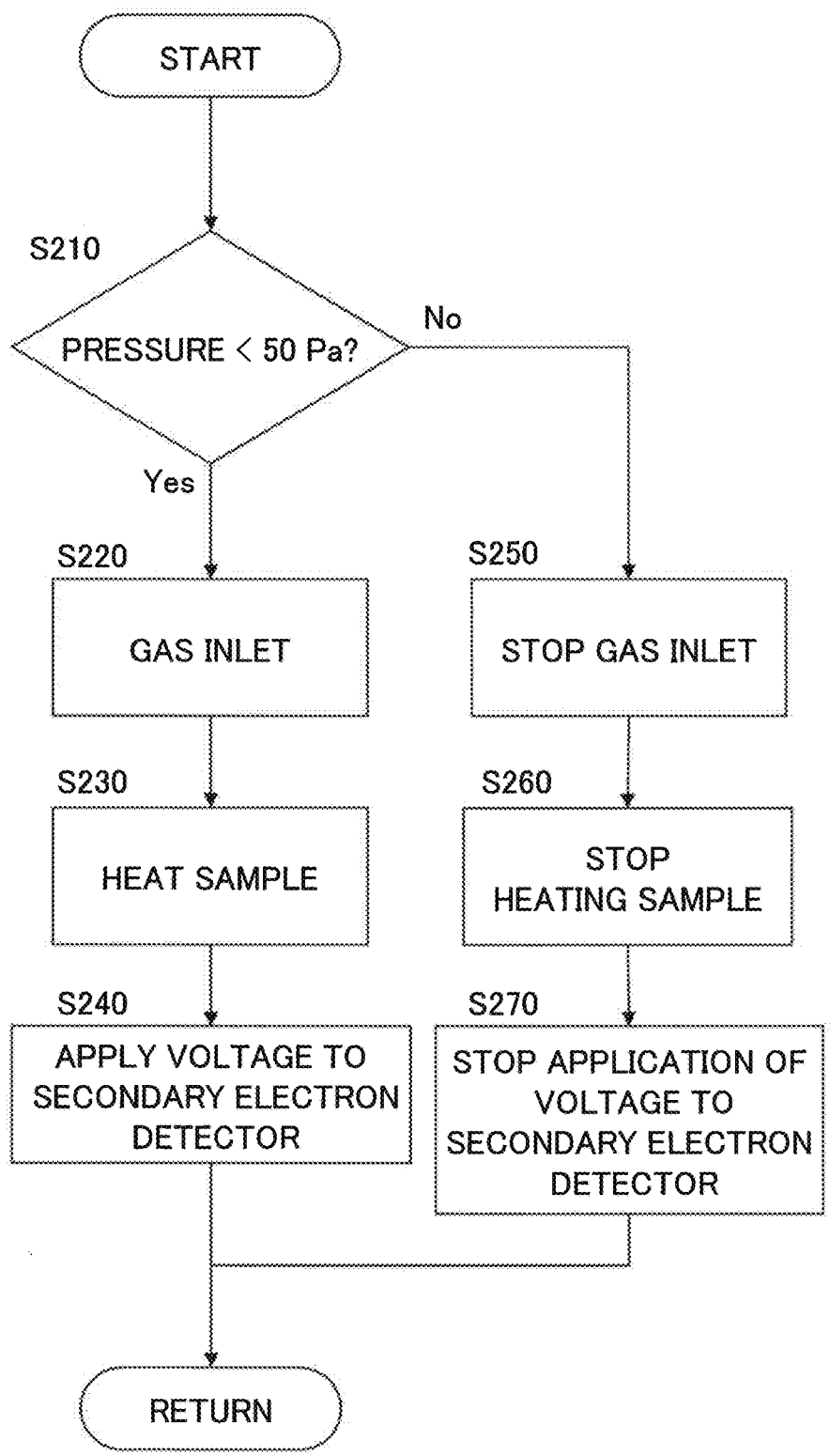
FIG. 8 is a flowchart of control processing of the gas inlet device 60, the secondary electron detector 51, and a heater 64 according to the embodiment of the present invention.

In a case in which the sample 70 is heated, control processing illustrated in FIG. 8 is performed. FIG. 8 is a flowchart of control processing of the gas inlet device 60, the secondary electron detector 51, and the heater 64 according to the embodiment of the present invention. When the processing illustrated in this figure is started, the gas control device 81, the detector control device 82, and the heater control device 83 determine whether or not the pressure value indicated by the vacuum gauge 65 is less than P1 (50 [Pa]) (S210).

When the pressure value of the vacuum gauge 65 is less than P1 in S210, the gas control device 81 controls the adjusting valve 62 so that the opening of the adjusting valve 62 may be a predetermined value, and gas inlet to the sample from the gas inlet device 60 is started (S220). Subsequently, the heater control device 83 heats the sample 70 at a predetermined temperature by means of the heater 64 (S230). Also, the detector control device 82 applies extraction voltage to the secondary electron detector 51 (S240), and the processing returns to S210. Accordingly, since the pressure around the secondary electron detector 51 is kept at less than 50 [Pa] even in the gas atmosphere to prevent electric discharge from being generated, a secondary electron image of the sample heated in the gas atmosphere can be obtained continuously. Thus, a moving image of the secondary electron image of the sample 70 in the gas atmosphere can be obtained. Meanwhile, an image obtained based on a detection value of a detector without fear of electric discharge since no voltage is applied at the time of detection of electrons is naturally obtained as a moving image.

Conversely, when the pressure value of the vacuum gauge 65 is P1 or more in S210, the gas control device 81 closes the adjusting valve 62, and gas inlet to the sample from the gas inlet device 60 is stopped (S250). Subsequently, the heater control device 83 stops heating of the sample 70 by the heater 64 (S260). Also, the detector control device 82 stops application of extraction voltage to the secondary electron detector 51 (S270), and the processing returns to S210. Since the sample chamber housing the sample holder 53 is evacuated by the vacuum pumps (the turbo-molecular pump TMP and the dry pump DRP) at a fixed evacuation volume, the pressure around the sample 70 decreases toward a value less than the set value P1 when gas inlet by the gas control device 81 is stopped as described above.

Next, a procedure of obtaining a microscopic image (a moving image) of the sample by means of the electron microscope according to the embodiment of the present invention will be described briefly. An observer searches a captured target from a field of view with use of the keyboard 44 and the mouse 57. Lens data for a scanning image and/or a scanning transmission image stored in the ROM 46 is read out and is output to the digital-analog converters (DACs) 24 to 34. The digital-analog converters (DACs) 24 to 34 convert the data of lens systems into analog signals and output them to the excitation power supplies 13 to 23. The excitation power supplies 13 to 23 output current to the lens coils 2, 3, 6, and 9 to 12 of the respective lens systems.

The electron beam generated by the electron gun 1 is focused by the first and second illumination lens coils 2 and 3, is scanned by the first and second deflection coils 4 and 5, is imaged by the objective lens coil 6, and is emitted to the sample 70 in the sample holder 53.

At this time, secondary electrons excited by the electron beam (primary electrons) and generated from the sample 70 are detected by the secondary electron detector 51, electrons generated when the primary electrons are reflected on the sample 70 (backscattered electrons) are detected by the backscattered electron detector 55, light emitted from the sample 70 is detected by a cathodoluminescence detector (a CL detector) 54, and X-rays emitted from the sample 70 are detected by an X-ray detector 52. The outputs of these detectors 51, 55, 54, and 52 are output to the computer via the image capturing interface 48 and are arbitrarily drawn on a screen of the monitor 39 as a scanning image (a SEM image) such as a secondary electron image and a backscattered electron image.

Also, electrons of the electron beam transmitted through the sample 70, scattered, and diffracted (scattered electrons) are detected by the dark field image detector, and electrons transmitted through the sample 70 but not scattered or diffracted (transmitted electrons) are detected by the bright field image detector. The outputs of these detectors are output to the computer via the image capturing interface 48 and are arbitrarily drawn on the screen of the monitor 39 as a scanning transmission image (a STEM image) such as a dark field image and a bright field image.

Figure 9:
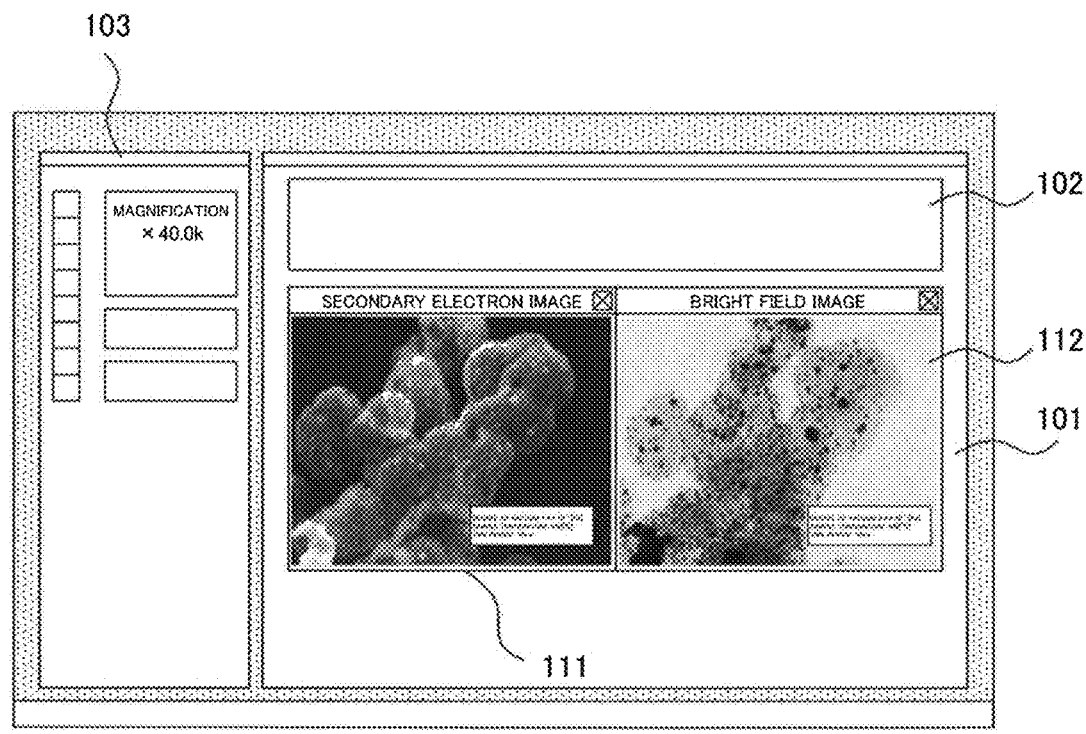
FIG. 9 illustrates an example of a display screen of a monitor 39 according to the embodiment of the present invention.

FIG. 9 illustrates an example of a display screen of the monitor 39 according to the embodiment of the present invention. The screen illustrated in this figure includes an image display part 101 displaying electron microscopic images 111 and 112, an image control part 102 adapted to control the images 111 and 112 displayed on the image display part 101, and a main control part 103 adapted to mainly operate the electron microscope.

On the image display part 101, one or more electron microscopic images are displayed in windows. The number of windows to be displayed on the image display part 101 can be increased or decreased freely via the main control part 103. In the example illustrated in FIG. 9, two windows (images) 111 and 112 are displayed.

Figure 10:
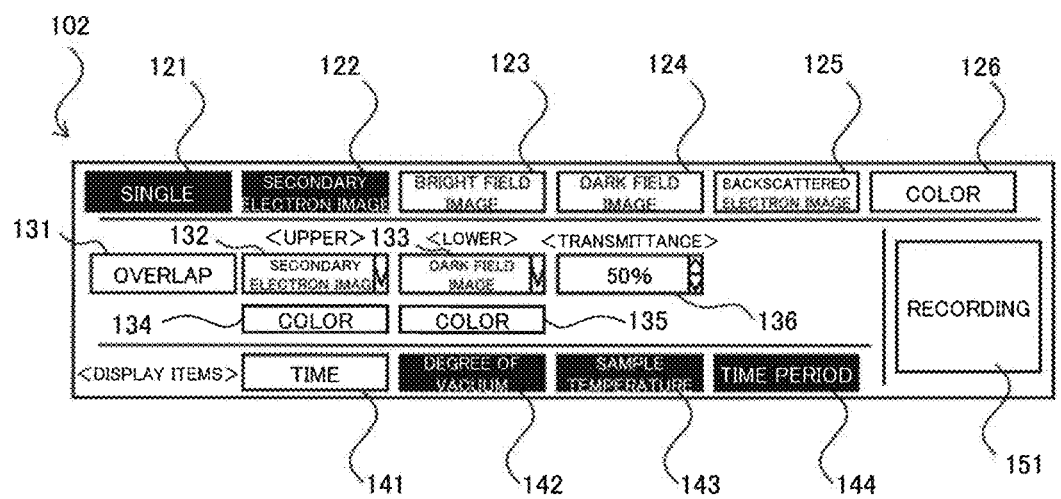
FIG. 10 is an enlarged view of an image control part 102.

In the image control part 102, an image in a window selected with use of the mouse 57 or the like from the windows 111 and 112 displayed on the image display part 101 (hereinbelow sometimes referred to as "a selected window") can be controlled. FIG. 10 is an enlarged view of the image control part 102. As illustrated in this figure, the image control part 102 includes a single button 121, a secondary electron image button 122, a bright field image button 123, a dark field image button 124, a backscattered electron image button 125, a color button 126, an overlap button 131, an upper image pull-down menu 132, a lower image pull-down menu 133, a color button 134, a color button 135, a transmittance input part 136, a time button 141, a degree-of-vacuum button 142, a sample temperature button 143, a time period button 144, and a recording button 151. In the example in FIG. 10, selected buttons are displayed black while non-selected buttons are displayed white.

When one selects either of the windows 111 and 112 in the image display part 101 and presses the secondary electron image button 122, a secondary electron image detected by the secondary electron detector 51 at the time is displayed in the selected window as a real-time moving image. Similarly, when one presses the bright field image button 123, a bright field image is displayed in the selected window. When one presses the dark field image button 124, a dark field image is displayed in the selected window. When one presses the backscattered electron image button 125, a backscattered electron image is displayed in the selected window. Only one out of these buttons 122, 123, 124, and 125 can be pressed. When one presses a button other than a selected button, selection of the selected button is cancelled. In this manner, an image in the selected window can be switched. Since the secondary electron image, the bright field image, the dark field image, and the backscattered electron image can be displayed in turn in real time at an operator's request, movement of particles of the sample 70 can be figured out easily, for example.

When one presses the color button 126, the image displayed in the selected window is changed from a grayscale image to a pseudo-color image. The pseudo-color image herein is an image displayed using gradation of green as a single chromatic color, for example, instead of gradation from white to black. The color button 126 can be selected at the same time as another button 122, 123, 124, or 125. When one presses the color button 126 again, selection is cancelled, and the display image returns to the grayscale image.

When one selects either of the windows 111 and 112 in the image display part 101 and presses the time period button 141, a capturing time of the image is displayed on the image in the selected window. When one presses the degree-of-vacuum button 142, the degree of vacuum (pressure) of the vacuum gauge 65 at the capturing time of the image is displayed on the image in the selected window. When one presses the sample temperature button 143, a sample temperature at the capturing time of the image is displayed on the image in the selected window. When one presses the time period button 144, lapse time from time when the observation of the sample 70 is started to the capturing time of the image is displayed on the image in the selected window. The observation start time of the sample 70 is specified by the operator via the main control part 103.

Meanwhile, although the time, the degree of vacuum, the sample temperature, and the time period are displayed on the image in the window in the example illustrated in the figure, they may be displayed at other places on the screen. Also, it is to be understood that information relating to the image (e.g., the total energy amount applied to the sample 70 by the heater 64 during the observation and observation conditions of the electron microscope such as acceleration voltage of electrons, magnification, and a scale bar) other than the time, the degree of vacuum, the sample temperature, and the time period may be displayed.

The recording button 151 is a button adapted to store (record) the image (the moving image) displayed in the selected window in the storage device (e.g., the HDD and the ROM) in the computer 80. When one presses the recording button 151, a video recording start signal is output to the video recording control device 95, and recording of the moving image in the selected window is started. Conversely, when one presses the recording button 151 again, a video recording stop signal is output to the video recording control device 95, and recording is stopped. Meanwhile, although the video recording control device 95 is configured to start recording when the recording button 151 is pressed in the present embodiment, the video recording control device 95 may be configured to automatically record all of the moving images captured via the respective detectors 51, 55, 49, and 50 during the operation of the electron microscope. Also, the recorded moving images may be allowed to be displayed on the image display part 101 at the end of the observation. In this case, display of the recorded moving images may be operated via the image display part 101 and the image control part 102.

Figure 11:
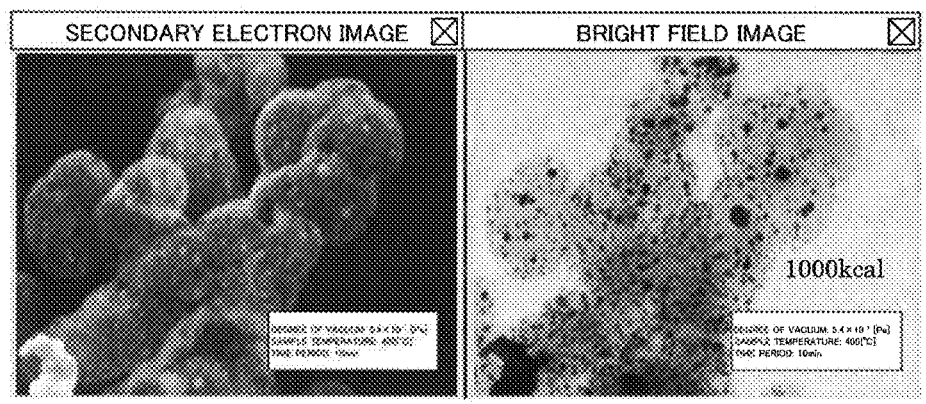
FIG. 11 illustrates an example of an image display part 101 in a case in which a secondary electron image is displayed in a window 111 and in which a bright field image is displayed in a window 112.

FIG. 11 illustrates an example of the image display part 101 in a case in which a secondary electron image is displayed in the window 111 and in which a bright field image is displayed in the window 112. The images displayed in the respective windows 111 and 112 are synchronized and are created based on the outputs detected at an equal time by the respective detectors 51, 55, 49, and 50. In the example illustrated in this figure, the degree-of-vacuum button 142, the sample temperature button 143, and the time period button 144 are pressed for the respective windows 111 and 112, and the degree of vacuum, the sample temperature, and the time period are displayed on the images in the respective windows 111 and 112. When the sample 70 is observed in situ with use of the secondary electron image, a three-dimensional change of the sample can be observed. Accordingly, for example, a state in which particles residing on the surface of the sample 70 out of particles of the sample 70 are moving and sinking into the inside of the sample from the surface of the sample can be observed.

Also, when the secondary electron image and the bright field image are arranged in parallel and displayed at the same time as in FIG. 11, the surface and the inside of the sample 70 can be observed at the same time. Thus, for example, in a case in which it can be confirmed that particles reside on the surface of the sample 70 on the secondary electron image at a certain time and thereafter disappear from the secondary electron image but still reside on the bright field image, it is possible to easily confirm that the particles residing on the surface of the sample 70 have moved from the surface of the sample to the inside of the sample.

Figure 12:
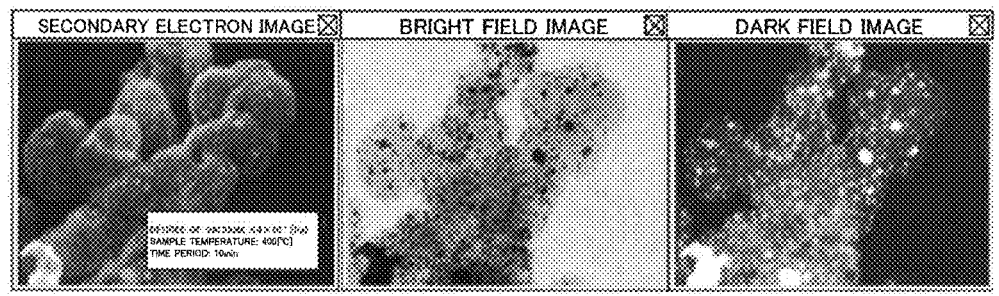
FIG. 12 illustrates an example in a case in which three windows 111, 112, and 113 are displayed on the image display part 101 at the same time.

FIG. 12 illustrates an example in a case in which three windows 111, 112, and 113 are displayed on the image display part 101 at the same time. In the example illustrated in this figure, a dark field image is displayed on the added window 113. In the case in which the secondary electron image, the bright field image, and the dark field image detected at an equal time are displayed at the same time in this manner, the surface, the inside, and the back surface of the sample 70 can be observed at the same time, and it is possible to easily figure out where the particles of the sample 70 are located, on the surface, in the inside, or on the back surface, for example. Also, the backscattered electron image may be displayed on the image display part 101 by adding a window or instead of any of the images. When the backscattered electron image is displayed, an obtained image is like combination of the secondary electron image with the dark field image since the backscattered electron image allows the surface and the inside of the sample to be viewed.

Figure 13:
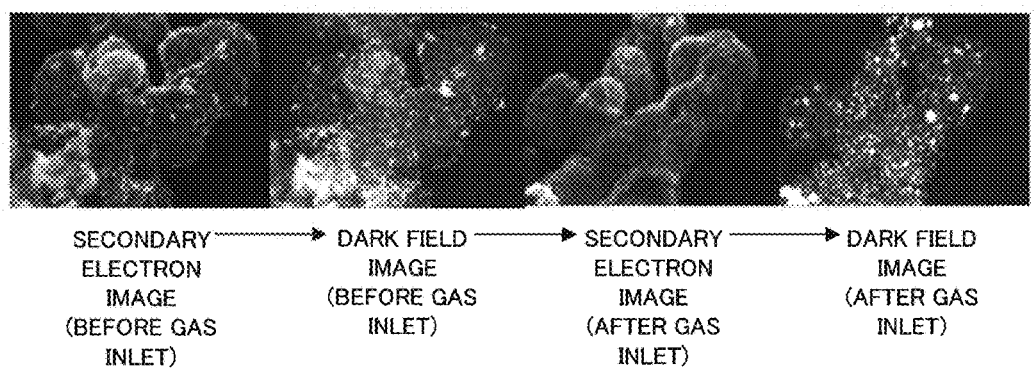
FIG. 13 illustrates an example in a case in which several kinds of images are arbitrarily switched and displayed on one window.

FIG. 13 illustrates an example in a case in which several kinds of images are arbitrarily switched and displayed on one window. Selection of an image to be displayed on a selected window (switching of images) can be performed by pressing the secondary electron image button 122, the bright field image button 123, the dark field image button 124, and the backscattered electron image button 125. By doing so, any one of the secondary electron image, the bright field image, the dark field image, and the backscattered electron image captured at an equal time can be displayed in the selected window. The example illustrated in the figure shows a case in which the displayed image is switched from the secondary electron image to the dark field image before gas inlet, and in which the displayed image is switched from the secondary electron image to the dark field image after gas inlet. In this manner, by switching the kinds of images in real time during the observation, movement of the particles of the sample 70 can easily be figured out visually, for example.

Description will be provided by returning to FIG. 10. When one selects either of the windows 111 and 112 in the image display part 101 and presses the overlap button 131, two out of the secondary electron image, the bright field image, the dark field image, and the backscattered electron image can be displayed in the selected window so as to overlap with each other.

The upper image pull-down menu 132 allows the operator to select an image to be displayed on the upper side from among the secondary electron image, the bright field image, the dark field image, and the backscattered electron image in the window for which the overlap button 131 has been pressed, and the secondary electron image is selected in the example in FIG. 10. The lower image pull-down menu 133 allows the operator to select an image to be displayed on the lower side from among the secondary electron image, the bright field image, the dark field image, and the backscattered electron image in the window for which the overlap button 131 has been pressed, and the dark field image is selected in the example in FIG. 10. The single button 121 is used to recover single display from overlap display when the selected window is in a state of the overlap display by pressing the overlap button 131. Meanwhile, an image to be displayed in the selected window at the time of recovery of the single display shall be determined based on buttons (the secondary electron image button 122, the bright field image button 123, the dark field image button 124, the backscattered electron image button 125, and the color button 126) pressed at the time of the recovery.

The transmittance input part 136 is adapted to set and change transmittance of an image located on the upper side (an image selected in the upper image pull-down menu 132) out of two microscopic images displayed in the selected window in an overlapping state, and the transmittance is set to 50% in the example in FIG. 10. The setting of the transmittance by means of the transmittance input part 136 is reflected in real time in the upper image in the selected window.

The color button 134 is adapted to change an image selected in the upper image pull-down menu 132 to a color image. When one presses the color button 134, the upper image is changed from a grayscale image to a color image. The color button 135 is adapted to change an image selected in the lower image pull-down menu 133 to a color image. When one presses the color button 135, the lower image is changed from a grayscale image to a color image. When one presses the color button 134 or 135 again, selection is cancelled, and the image returns to the grayscale image.

Figure 14:
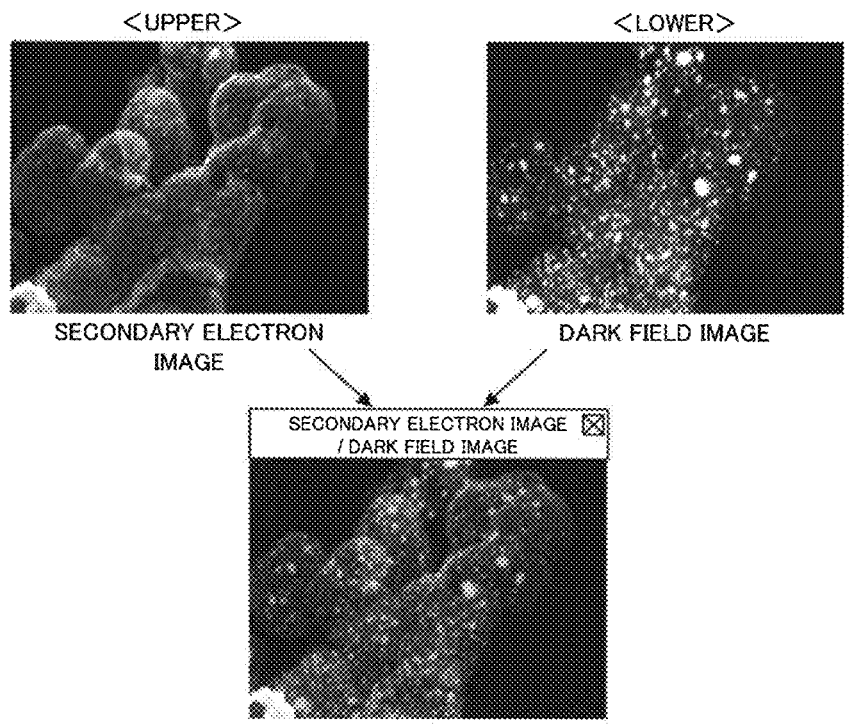
FIG. 14 illustrates an example in a case in which the secondary electron image is displayed on a dark field image in an overlapping manner.
Figure 15:
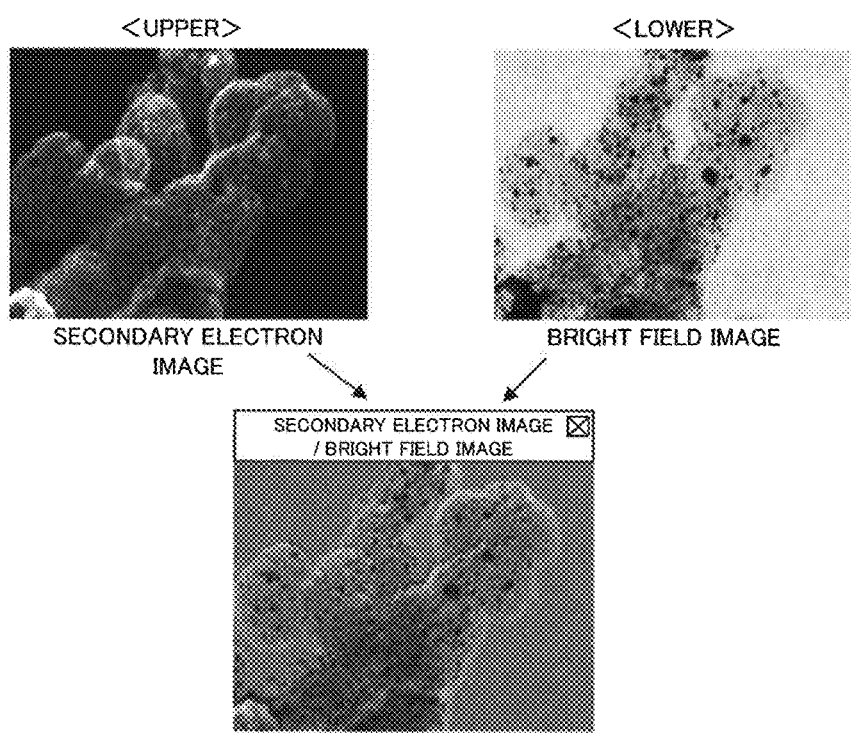
FIG. 15 illustrates an example in a case in which the secondary electron image is displayed on the bright field image in an overlapping manner.

FIG. 14 illustrates an example in a case in which the secondary electron image is displayed on the dark field image in an overlapping manner, and FIG. 15 illustrates an example in a case in which the secondary electron image is displayed on the bright field image in an overlapping manner. In this manner, in the case in which the two images are displayed in one window in the overlapping manner, even when the particles of the sample 70 disappear from the surface on the secondary electron image, it is possible to easily figure out that the particles reside on the dark field image or the bright field image which is transparent below the secondary electron image. Accordingly, in comparison with a case in which plural images are displayed at the same time as in FIG. 12 for comparison and consideration, it is possible to easily figure out that the particles do not disappear but has gone inside the sample from the surface.

Figure 16:
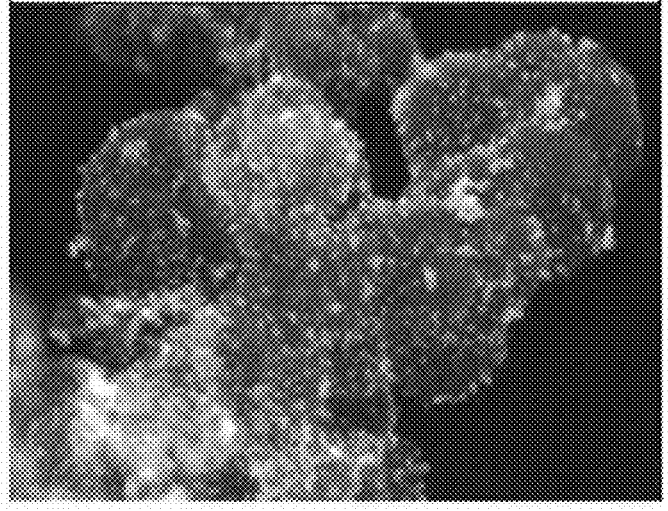
FIG. 16 illustrates an example in a case in which the secondary electron image is displayed on the dark field image in an overlapping manner for a sample before gas inlet.
Figure 17:
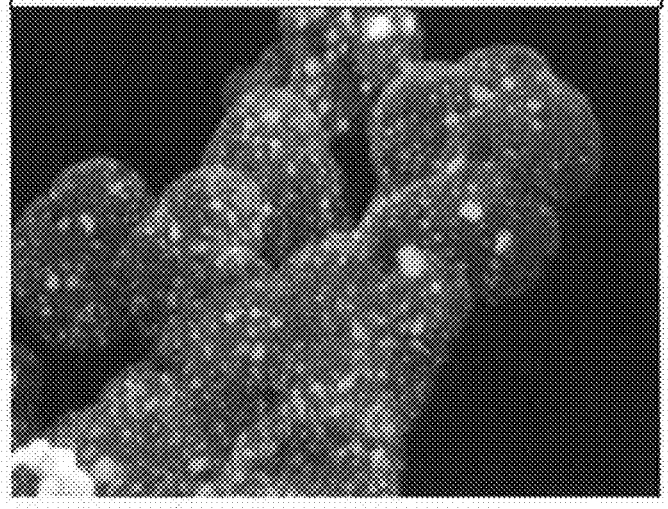
FIG. 17 illustrates an example in a case in which the secondary electron image is displayed on the dark field image in an overlapping manner for the sample after gas inlet.
Figure 18:
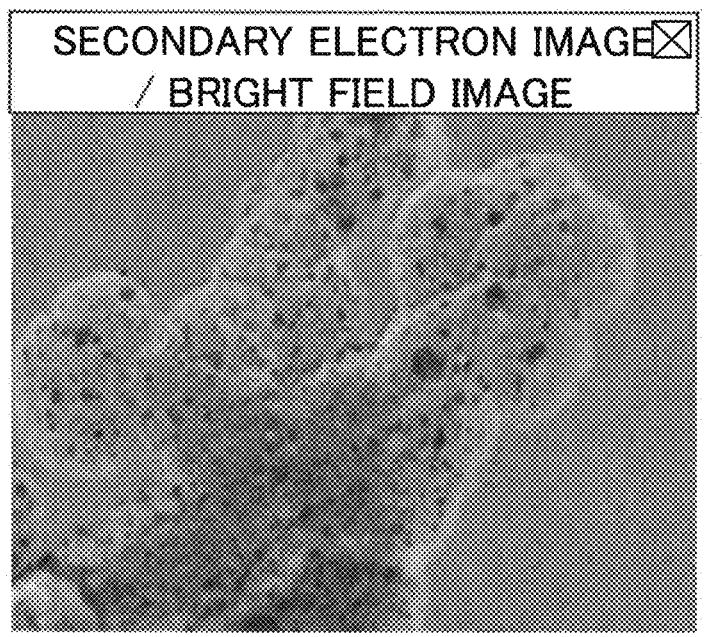
FIG. 18 illustrates an example in a case in which the secondary electron image is displayed on the bright field image in an overlapping manner for the sample after gas inlet.

FIG. 16 illustrates an example in a case in which the secondary electron image (color) is displayed on the dark field image (grayscale) in an overlapping manner for the sample before gas inlet, FIG. 17 illustrates an example in a case in which the secondary electron image (color) is displayed on the dark field image (grayscale) in an overlapping manner for the sample after gas inlet, and FIG. 18 illustrates an example in a case in which the secondary electron image (color) is displayed on the bright field image (grayscale) in an overlapping manner for the sample after gas inlet.

On the two overlapping images displayed in grayscale, when respective parts displayed black having similar darkness on the two respective images reside at the same or close places, the two images cannot be distinguished in some cases. However, when the grayscale image and the color image are displayed in one window in the overlapping manner as in the above case, the images can be distinguished by differences in color. Accordingly, for example, it is possible to easily determine on which image a particle is displayed, and it is possible to easily figure out the position of the particle.

Meanwhile, in the present embodiment, control of the gas inlet device 60 is performed based on a detection value of the vacuum gauge 65 installed close to the sample 70. However, even when the vacuum gauge 65 is installed close to the secondary electron detector 51 (e.g., in the third intermediate chamber 74 in FIG. 4), and control of the gas inlet device 60 is performed based on a detection value thereof, electric discharge can be prevented from being generated. However, since the degree of vacuum around the sample 70 gives an indication of mass of gas sprayed to the sample 70, the energy amount burned at the sample 70 can be calculated based on the heating temperature and the degree of vacuum. Thus, from a viewpoint of accurate calculation of the energy amount, it is preferable to install the vacuum gauge 65 as close to the sample 70 as possible as in the present embodiment. Nonetheless, even in the above configuration, in which the vacuum gauge 65 is installed close to the secondary electron detector 51, the degree of vacuum close to the secondary electron detector 51 is not worse than that close to the sample 70 since the third intermediate chamber 74 housing the secondary electron detector 51 itself is evacuated by the vacuum pumps 88 and 89 via the independent path from the place close to the sample 70, and thus there is no problem in gas control. As a matter of course, a configuration in which another vacuum gauge is installed close to the secondary electron detector 51 in addition to the vacuum gauge close to the sample 70, in which the energy amount is calculated based on the vacuum gauge close to the sample 70, and in which gas control is performed based on the vacuum gauge close to the secondary electron detector 51 may be available.

Further, the case in which the secondary electron image is obtained by preventing electric discharge of the secondary electron detector 51 in a gas atmosphere has been described above. However, the present invention can be applied to any electron microscope including a detector that requires consideration for generation of electric discharge in a gas atmosphere since application of voltage is required at the time of observation. For example, there is a dark field image detector of a type in which a conversion plate (a gold-deposited plate) is irradiated with a scattered electron beam, and in which the electron beam is extracted by extraction voltage. To the dark field image detector of this type, voltage is applied in a similar manner to the case of the secondary electron detector 51 in the present embodiment, and electric discharge may be generated depending on the degree of vacuum. Accordingly, the present invention can be applied to the dark field image detector of this type.

Still further, in the above description, the gas inlet device 60 is provided in the sample holder 53. However, the gas inlet device 60 may be installed independently from the sample holder 53 as long as the gas inlet device 60 can introduce gas to the sample 70 in the sample holder 53.

Also, the present invention is not limited to the above embodiments and includes various modification examples without departing from the scope of the present invention. For example, the present invention is not limited to one having all of the components described in the above embodiments but includes one from which part of the components is deleted. Also, part of components according to an embodiment can be added to or be replaced with components according to another embodiment.

Also, the respective components of the aforementioned computer and the various control devices and the functions, the execution processing, and the like of the respective components may be achieved in whole or in part by hardware (e.g., to design logic executing the respective functions in an integrated circuit). The components of the aforementioned computer and the various control devices may also be a program (software) causing the respective functions of the components of the computer and the various control devices to be achieved as a result of readout and execution thereof by an arithmetic processing unit (e.g., a CPU). Information for the program can be stored in a semiconductor memory (such as a flash memory and an SSD), a magnetic storage device (such as a hard disk drive), a recording medium (such as a magnetic disk and an optical disk), and the like.

Also, in the above description of the respective embodiments, control lines and information lines that seem to be necessary to describe the embodiments have been illustrated, but not all of the control lines and information lines for the product are illustrated. In practice, almost all of the components may be considered to be connected to each other.

REFERENCE SIGNS LIST 1 electron gun
2 first illumination lens coil
3 second illumination lens coil
4 first deflection coil
5 second deflection coil
6 objective lens coil
7 first electromagnetic sample image moving coil
8 second electromagnetic sample image moving coil
9 first intermediate lens coil
10 second intermediate lens coil
11 first projection lens coil
12 second projection lens coil
13 to 23 excitation power supply
24 to 34 DAC
35 microprocessor
36 storage device
37 arithmetic logical unit
38 monitor controller
39 monitor
40 to 41 I/F
42 magnification changing rotary encoder
43 input rotary encoder
44 keyboard
45 RAM
46 ROM
47 scanning image capturing interface
48 image capturing interface
49 bright field image detector
50 dark field image detector
51 secondary electron detector
52 X-ray detector
53 sample holder
54 CL detector
55 backscattered electron detector
59 heater
60 gas inlet device
62 adjusting valve
63 injection opening
64 heater
65 vacuum gauge
70 sample
77 vacuum gauge
81 gas control device
82 detector control device
83 heater control device
90 pressure display unit
95 video recording control device
101 image display part

The invention claimed is:

1. An electron microscope, comprising:
a detector which detects an electron generated when a sample is illuminated with an electron beam from an electron gun;
a display device which displays a microscopic image of the sample based on an output of the detector;
a gas inlet device which emits gas to the sample;
a gas control device which controls a gas emitting amount of the gas inlet device so that a degree of vacuum in a space in which the detector is installed may continuously be kept at less than a set value during gas emission performed by the gas inlet device;
a heater which heats the sample; and
a heater control device which controls the heater;
wherein the detector is a secondary electron detector which detects the electron generated by the electron beam and a bright field image detector and a dark field image detector which detect the electron of the electron beam transmitted through the sample;
wherein the display device displays as the microscopic image a secondary electron image detected by the secondary electron detector and a microscopic image detected by the bright field image detector or the dark field image detector at an equal time as the secondary electron image;
wherein the display device includes a display part on which two out of the secondary electron image detected by the secondary electron detector, a bright field image detected by the bright field image detector at the equal time as the secondary electron image, and a dark field image detected by the dark field image detector at the equal time as the secondary electron image are displayed to overlap with each other;
wherein transmittance of a microscopic image located on an upper side out of the two microscopic images displayed on the display part to overlap with each other is changeable;
wherein, on the display device, a lapse time of observation of the sample, a degree of vacuum around the sample at the lapse time, and a temperature of the sample at the lapse time are displayed; and
wherein the heater control device executes heating of the sample by the heater when the degree of vacuum is less than the set value but does not execute heating of the sample by the heater when the degree of vacuum is equal to or greater than the set value.

2. The electron microscope according to claim 1, wherein voltage is applied to the detector when the detector detects the electron generated by the electron beam, and
the set value is set to a value which does not cause electric discharge even when the voltage is applied to the detector.

3. The electron microscope according to claim 1, wherein the detector is a secondary electron detector which detects the electron generated by the electron beam, and
the microscopic image is a secondary electron image detected by the secondary electron detector.

4. The electron microscope according to claim 1, wherein the detector is a backscattered electron detector which detects the electron generated by the electron beam, and
the microscopic image is a backscattered electron image detected by the backscattered electron detector.

5. The electron microscope according to claim 1, wherein, on the display device, the secondary electron image detected by the secondary electron detector and the microscopic image detected by the bright field image detector or the dark field image detector at the equal time as the secondary electron image are displayed simultaneously.

6. The electron microscope according to claim 1, wherein the display device includes a display part on which one out of the secondary electron image detected by the secondary electron detector, a bright field image detected by the bright field image detector at the equal time as the secondary electron image, and a dark field image detected by the dark field image detector at the equal time as the secondary electron image is displayed, and a microscopic image to be displayed on the display part is selectable.

7. The electron microscope according to claim 1, wherein one out of the two microscopic images displayed on the display part to overlap with each other is displayed in color.

8. The electron microscope according to claim 1, further comprising:
a recording device which records a microscopic image displayed on the display device.

9. A sample observation method using an electron microscope, comprising:
controlling a gas emitting amount emitted to a sample so that a degree of vacuum in a space in which a detector which detects an electron generated when the sample is illuminated with an electron beam generated from an electron gun is installed may continuously be kept at less than a set value; and
detecting the electron generated at time of illumination with the electron beam at the detector and displaying a microscopic image on a display device based on an output of the detector;
wherein the detector is a secondary electron detector which detects the electron generated by the electron beam and a bright field image detector and a dark field image detector which detect the electron of the electron beam transmitted through the sample;
wherein the display device displays as the microscopic image a secondary electron image detected by the secondary electron detector and a microscopic image detected by the bright field image detector or the dark field image detector at an equal time as the secondary electron image;
wherein the display device includes a display part on which two out of the secondary electron image detected by the secondary electron detector, a bright field image detected by the bright field image detector at the equal time as the secondary electron image, and a dark field image detected by the dark field image detector at the equal time as the secondary electron image are displayed to overlap with each other;
wherein transmittance of a microscopic image located on an upper side out of the two microscopic images displayed on the display part to overlap with each other is changeable; and
wherein, on the display device, a lapse time of observation of the sample, a degree of vacuum around the sample at the lapse time, and a temperature of the sample at the lapse time are displayed; and
executing heating of the sample by a heater when the degree of vacuum is less than the set value but not executing heating of the sample by the heater when the degree of vacuum is equal to or greater than the set value.

10. The electron microscope according to claim 1, further comprising:
a sample holder that holds the sample; and
a vacuum gauge that measures the degree of vacuum;
wherein the vacuum gauge is attached to the sample holder.

11. The electron microscope according to claim 1, further comprising:
a sample holder that holds the sample; and
a vacuum gauge that measures the degree of vacuum;
wherein the vacuum gauge is disposed independently of the sample holder.

12. The sample observation method according to claim 9, wherein the secondary electron image is displayed as a real-time moving image.

13. An electron microscope, comprising:
a detector which detects an electron generated when a sample is illuminated with an electron beam from an electron gun;
a display device which displays a microscopic image of the sample based on an output of the detector;
a gas inlet device which emits gas to the sample; and
a gas control device which controls a gas emitting amount of the gas inlet device so that a degree of vacuum in a space in which the detector is installed may continuously be kept at less than a set value during gas emission performed by the gas inlet device;
a heater which heats the sample; and
a heater control device which controls the heater, wherein
voltage is applied to the detector when the detector detects the electron generated by the electron beam, and
the set value is set to a value which does not cause electric discharge even when the voltage is applied to the detector, and
the heater control device executes heating of the sample by the heater when the degree of vacuum is less than the set value but does not execute heating of the sample by the heater when the degree of vacuum is equal to or greater than the set value.

* * * * *